(12) United States Patent
Zhang

(10) Patent No.: US 11,398,621 B2
(45) Date of Patent: Jul. 26, 2022

(54) DISPLAY PANEL AND METHOD OF MANUFACTURING THE SAME

(71) Applicant: WUHAN CHINA STAR OPTOELECTRONICS SEMICONDUCTOR DISPLAY TECHNOLOGY CO., LTD., Hubei (CN)

(72) Inventor: Yonghui Zhang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 117 days.

(21) Appl. No.: 16/966,157

(22) PCT Filed: Jan. 3, 2020

(86) PCT No.: PCT/CN2020/070171
§ 371 (c)(1),
(2) Date: Jul. 30, 2020

(87) PCT Pub. No.: WO2021/103285
PCT Pub. Date: Jun. 3, 2021

(65) Prior Publication Data
US 2021/0159468 A1    May 27, 2021

(51) Int. Cl.
*H01L 51/56* (2006.01)
*H01L 27/32* (2006.01)
*H01L 51/00* (2006.01)

(52) U.S. Cl.
CPC .......... *H01L 51/56* (2013.01); *H01L 27/3276* (2013.01); *H01L 27/3288* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

2017/0237025 A1* 8/2017 Choi .................... H01L 51/5256
257/40
2017/0277288 A1* 9/2017 Choi .................... H01L 51/5253
(Continued)

FOREIGN PATENT DOCUMENTS

| CN | 103097098 A | 5/2013 |
| CN | 107564415 A | 1/2018 |

(Continued)

*Primary Examiner* — J. E. Schoenholtz
(74) *Attorney, Agent, or Firm* — Mark M. Friedman

(57) ABSTRACT

A display panel and a method of manufacturing the same are disclosed. The display panel comprises a bending area for bending of the display panel, and the bending area includes a plurality of film layers which include a substrate, a first elastic layer disposed on the substrate, and a metal layer disposed on the first elastic layer. The metal layer includes a plurality of metal portions, and the metal portion includes at least one portion having an arch shape. A first elastic layer includes at least one curved surface on a side of the first elastic layer close to the metal layer, and each of the curved surfaces matches a shape of a side of the corresponding metal portion close to the first elastic layer.

5 Claims, 11 Drawing Sheets

(56) References Cited

U.S. PATENT DOCUMENTS

| | | | | |
|---|---|---|---|---|
| 2021/0049939 A1* | 2/2021 | Sui | ............... | G09F 9/301 |
| 2021/0257597 A1* | 8/2021 | Hu | ............... | H01L 51/56 |

FOREIGN PATENT DOCUMENTS

| | | | |
|---|---|---|---|
| CN | 207116427 U | 3/2018 | |
| CN | 108022942 A | 5/2018 | |
| CN | 108231672 A | 6/2018 | |
| CN | 108231800 A | 6/2018 | |
| CN | 108288437 A | 7/2018 | |
| CN | 108470521 A | 8/2018 | |
| CN | 109004011 A | 12/2018 | |
| CN | 109004099 A | 12/2018 | |
| CN | 109448554 A | 3/2019 | |
| CN | 109585461 A | 4/2019 | |
| CN | 110134287 A | 8/2019 | |
| CN | 209447443 U | 9/2019 | |
| CN | 110393507 A | 11/2019 | |
| KR | 20180060710 A | 6/2018 | |
| KR | 20180061856 A | 6/2018 | |

* cited by examiner

DISPLAY PANEL AND METHOD OF MANUFACTURING THE SAME

FIELD OF INVENTION

The present disclosure relates to the field of display technologies, in particular to the manufacturing of a display device, and more particularly, to a display panel and a method of manufacturing the same.

BACKGROUND OF INVENTION

Currently, the bending characteristics of an organic light-emitting diode (OLED) panel can achieve a high screen-to-body ratio and a narrow bezel.

In the prior art, as shown in FIG. 1, when an included angle between the binding area 01 and the display area 02 of the OLED panel is 180°, the strain of the bending area 03 is 0. As the included angle between the binding area 01 and the display area 02 increases or decreases, the tensile strain or compressive stress of the bending area 03 increases. When the tensile strain or compressive stress of the bending area 03 reaches a certain threshold value, the film layers inside the OLED panel may be damaged, so that the OLED panel cannot work normally, thereby reducing the reliability of the OLED panel.

In summary, it is necessary to provide an OLED display panel that can reduce the stress received by the bending area in a bending state.

SUMMARY OF INVENTION

Technical Problems

An object of the present disclosure is to provide a display panel and a method of manufacturing the same. By configuring the wrinkle shapes of a metal layer and a first elastic layer in film layers of a bending area to be mutually matched, the tensile stress received by the bending area during bending is reduced, thereby solving the problem that the film layers of the bending area in the prior art are easily damaged.

Technical Solutions

An embodiment of the present disclosure provides a display panel, comprising a bending area for bending of the display panel, the bending area including a plurality of film layers, the plurality of film layers including a substrate, a first elastic layer disposed on the substrate, and a metal layer disposed on the first elastic layer;

wherein the metal layer includes a plurality of metal portions, and the metal portion includes at least one portion having an arch shape; and the first elastic layer includes at least one curved surface on a side of the first elastic layer close to the metal layer, and each of the curved surfaces matches a shape of a side of the corresponding metal portion close to the first elastic layer.

In an embodiment, the plurality of metal portions are connected to form the continuous metal layer.

In an embodiment, the plurality of metal portions are in strip shapes, and the plurality of metal portions are spaced apart from each other and arranged in parallel.

In an embodiment, the first elastic layer includes a plurality of elastic portions, the plurality of elastic portions are in strip shapes, the plurality of elastic portions are spaced apart from each other and are arranged in parallel, and the plurality of elastic portions and the plurality of metal portions are disposed to intersect mutually.

In an embodiment, the plurality of film layers further includes a second elastic layer, and the second elastic layer is disposed on the metal layer.

In an embodiment, both materials of the first elastic layer and the second elastic layer include polydimethylsiloxane.

An embodiment of the present disclosure further provides a method of manufacturing a display panel, comprising:

providing a substrate;

forming a first elastic layer on the substrate;

coating metal material on the first elastic layer at a first preset temperature to form a metal layer; and adjusting the first preset temperature to a second preset temperature, so that the metal layer is formed with a plurality of metal portions, wherein the metal portion includes at least one portion in an arch shape, and rendering a side of the first elastic layer close to the metal layer to be formed with a plurality of curved surfaces, wherein each of the curved surfaces matches a shape of a side of the corresponding metal portion close to the first elastic layer.

In an embodiment, after the step of adjusting the first preset temperature to the second preset temperature, so that the metal layer is formed with a plurality of metal portions, wherein the metal portion includes at least one portion in the arch shape, and rendering the side of the first elastic layer close to the metal layer to be formed with the plurality of curved surfaces, wherein each of the curved surfaces matches the shape of the side of the corresponding metal portion close to the first elastic layer, the method further comprises:

forming a second elastic layer on the metal layer, wherein the metal layer is formed with the plurality of metal portions.

In an embodiment, both materials of the first elastic layer and the second elastic layer include polydimethylsiloxane.

An embodiment of the present disclosure further provides a method of manufacturing a display panel, comprising:

providing a substrate;

forming a plurality of photoresistive portions on the substrate, wherein the plurality of photoresistive portions are parallel to each other;

forming a metal layer on the plurality of photoresistive portions and the substrate, wherein the metal layer includes a plurality of metal portions, and the metal portion includes at least one portion having an arch shape;

removing the plurality of photoresistive portions so that a part of the plurality of metal portions is suspended; and forming a first elastic layer between the plurality of metal portions and the substrate, wherein a side of the first elastic layer close to the metal portions includes at least one curved surface, and each of the curved surfaces matches a shape of a side of the corresponding metal portion close to the first elastic layer.

In an embodiment, material of the first elastic layer includes polydimethylsiloxane.

Beneficial Effect:

The present disclosure provides a display panel and a method of manufacturing the same. The bending area of the display panel includes a metal layer and a first elastic layer. In the present disclosure, the metal layer is provided with a plurality of metal portions, and the metal portion includes at least one portion having an arch shape. In addition, a side of the first elastic layer close to the metal layer is provided with a plurality of curved surfaces, and each of the curved surfaces matches the shape of a side of the corresponding metal portion close to the first elastic layer. Thus, when the bending area is bent, the stress received by the film layers is gradually reduced from compressive stress to zero, and then become to the gradually increased tensile stress. The disclosure can reduce the stress received by the bending area during bending, thereby improving the fracture resistance of the film layers of the bending area.

DESCRIPTION OF DRAWINGS

The invention is further described below with reference to the drawings. It should be noted that, the accompanying drawings in the following description are merely used to explain some embodiments of the present disclosure, and a person of ordinary skill in the art may still derive other drawings from these accompanying drawings without creative efforts.

DETAILED DESCRIPTION OF PREFERRED EMBODIMENTS

Figure 1:
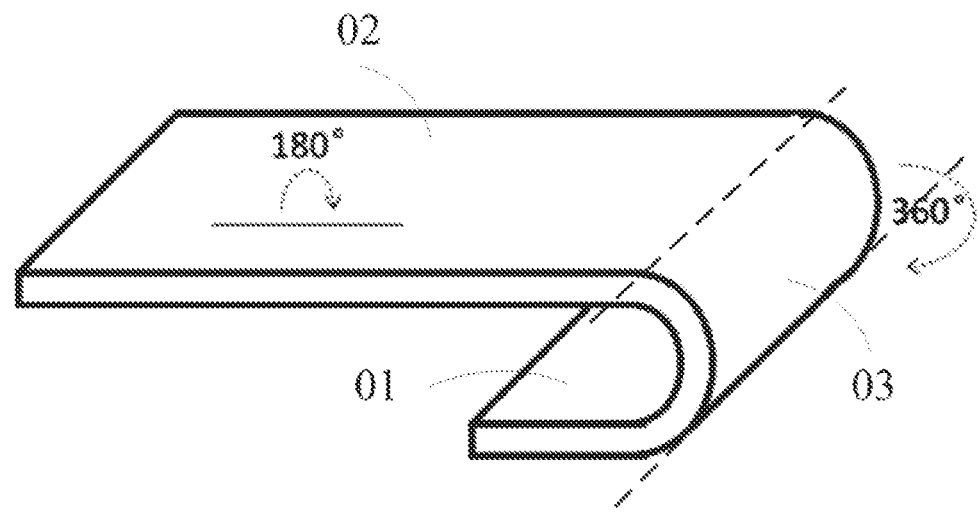
FIG. 1 is a schematic view of application of a display panel in the prior art.

The following clearly and completely describes the technical solutions in the embodiments of the present disclosure with reference to the accompanying drawings in the embodiments of the present disclosure. Apparently, the described embodiments are merely some but not all of the embodiments of the present disclosure. All other embodiments obtained by a person skilled in the art based on the embodiments of the present disclosure without creative efforts shall fall within the protection scope of the present disclosure.

In the description of the present disclosure, it should be understood that the orientation or position relationship indicated by the terms "upper", "lower", "surface", "vertical" and the like is based on the orientation or position relationship shown in the drawings. The term "upper" refers to the surface above the object, specifically to directly above, obliquely above, or upper surface, as long as it is above the level of the object. The term "surface" refers to two objects directly contact to each other. The above orientation or position relationship is merely for the convenience of describing the present disclosure and simplifying the description, and does not indicate or imply that the device or element referred to must have a specific orientation, be constructed and operate in a specific orientation, and therefore cannot be understood as a limitation on the present disclosure.

In addition, in the present disclosure, the structures in the accompanying drawings represent that the structure are placed in the horizontal direction, and thus the lengths or widths of the structures refer to the sizes in the horizontal direction, and the heights of the structures refer to the sizes in the vertical direction.

In addition, it should be noted that the drawings only provide structures and/or steps closely related to the present disclosure, and some details that are not related to the invention are omitted for simplifying the drawings so as to clarify the present disclosure. It does not mean that the device and/or method in practice is exactly the same as the drawing, and is not a limitation of the device and/or method in practice.

The present disclosure provides a display panel. Please refer to FIGS. 2-10 for details.

Figure 2:
FIG. 2 is a schematic cross-sectional structure view of a display panel according to an embodiment of the present disclosure.

As shown in FIG. 2, the display panel 10 provided by the present disclosure includes a bending area 100 for the bending of the display panel 10. The bending area 100 includes a plurality of film layers including a substrate 101, a first elastic layer 102 disposed on the substrate 101, and a metal layer 103 disposed on the first elastic layer 102.

In an embodiment, the substrate 101 may include a first substrate, a second substrate, and a third substrate which are sequentially disposed from bottom to top. Materials of the first substrate and the third substrate may be the same, e.g., a polyimide film. Specifically, the polyimide film may be formed by pyromellitic dianhydride and phenylenediamine in a strong polar solvent being condensated, casted into a film and then imidizated. Material of the second substrate may include inorganic material such as silicon nitride and silicon oxide.

Young's modulus of the second substrate may be larger than Young's modulus of the first substrate and the third substrate.

In an embodiment, as shown in FIGS. 3-9, the metal layer 103 includes a plurality of metal portions 1031. The metal portion 1031 includes at least one arch-shaped portion. The metal portion 1031 may include a convex arch-shaped portion and/or a concave arch-shaped portion. It may be understood that "the metal portion 1031 includes at least one arch-shaped portion" indicates that as seen in the cross-sectional view, the metal portion 1031 presents at least one arch shape, and is not limited to the specific shape shown in the top view of the metal portion 1031. Refer to the related description in FIGS. 6-9 below.

Figure 3:
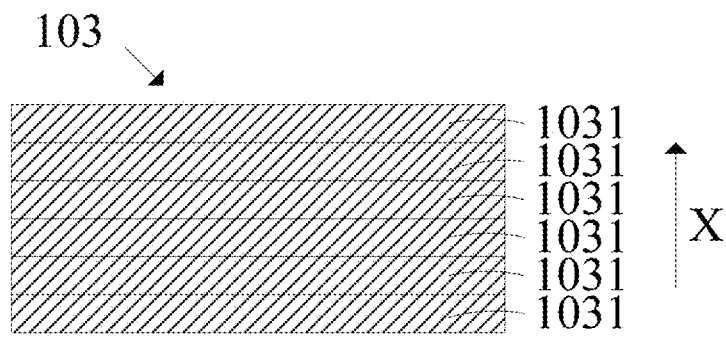
FIG. 3 is a schematic top view of a metal layer according to an embodiment of the present disclosure.
Figure 4:
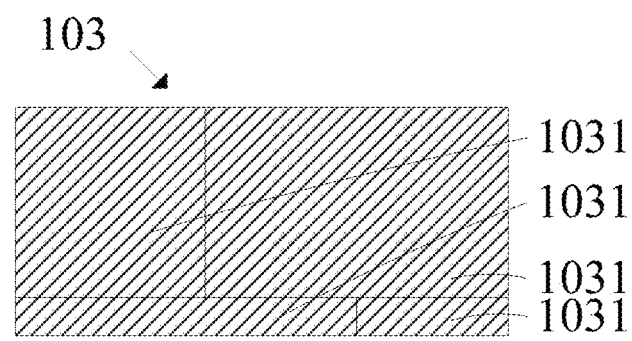
FIG. 4 is a schematic top view of another metal layer according to an embodiment of the present disclosure.

In an embodiment, as shown in FIGS. 3-4, the metal layer 103 includes a plurality of metal portions 1031, and the plurality of metal portions 1031 may be connected to form a continuous metal layer 103.

For example, as shown in FIG. 3, the plurality of metal portions 1031 may be connected along a preset direction X. The preset direction X may be any direction and may be determined according to actual conditions. It can be understood that, in this embodiment, the size of the plurality of metal portions 1031 is not limited, as long as it satisfies that the plurality of metal portions 1031 are connected to form the continuous metal layer 103.

In another example, as shown in FIG. 4, the plurality of metal portions 1031 may be connected in different directions. It can be understood that, in the above embodiment, the shape, size, and arrangement of the plurality of metal portions 1031 are not limited, as long as they satisfy that the plurality of metal portions 1031 are connected to form the continuous metal layer 103.

Figure 5:
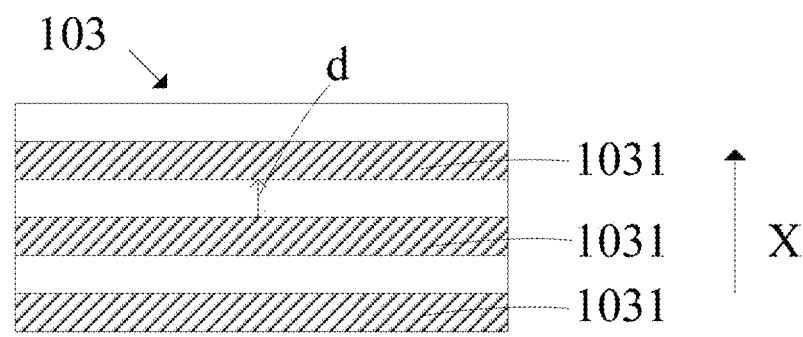
FIG. 5 is a schematic top view of another metal layer according to an embodiment of the present disclosure.

In an embodiment, as shown in FIG. 5, the plurality of metal portions 1031 may be in strip shapes, and the plurality of metal portions 1031 may be spaced apart from each other and arranged in parallel. The plurality of metal portions 1031 may be arranged in parallel along a predetermined direction X and spaced apart from each other by a predetermined distance d. It can be understood that the preset direction X may be any direction and may be determined according to actual conditions. The preset distance d between the adjacent metal portions 1031 may be any length, and may be determined according to actual conditions. Further, the distances between each of the adjacent metal portions 1031 may be different.

In an embodiment, as shown in FIGS. 6-9, specifically, the metal portion 1031 may include at least one arch-shaped portion 1032 which is in an arch shape. A side of the first elastic layer 102 close to the metal layer 103 (i.e., the metal portions 1031 in the figure) includes at least one curved surface 1021, and each of the curved surfaces 1021 matches a shape of a side of the corresponding metal portion 1031 close to the first elastic layer 102.

It should be noted that, as shown in the embodiments in FIGS. 6-9, the specific shapes of the top view of the metal portions 1031 are not limited.

Figure 6:
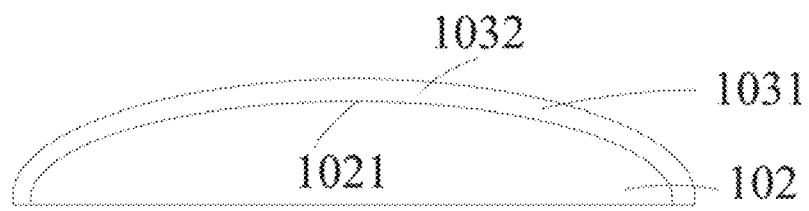
FIG. 6 is a schematic cross-sectional structure view of a first metal layer and a first elastic layer according to an embodiment of the present disclosure.

For example, as shown in FIG. 6, the metal portion 1031 may include an arch-shaped portion 1032 which is in an arch shape. A side of the first elastic layer 102 close to the metal layer 103 (i.e., the metal portions 1031 in the figure) includes at least one curved surface 1021, and the curved surface 1021 matches a shape of a side of the arch-shaped portion 1032 close to the first elastic layer 102. The length of the arch-shaped portion 1032 may be the length of the metal portion 1031. The specific parameters of the arch-shaped portion 1032 are not limited, and may be determined according to actual conditions.

Figure 7:
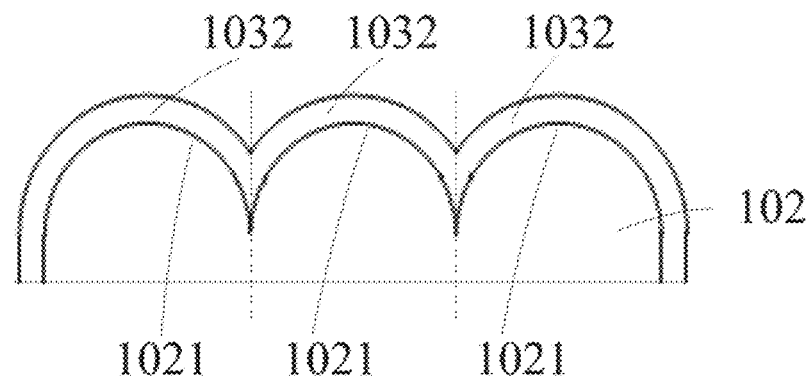
FIG. 7 is a schematic cross-sectional structure view of a second metal layer and a first elastic layer according to an embodiment of the present disclosure.

In another example, as shown in FIG. 7, the metal portion 1031 may include three arch-shaped portions 1032 which are in arch shapes. The three arch-shaped portions 1032 may be connected to form the continuous metal portion 1031. A side of the first elastic layer 102 close to the metal layer 103 (i.e., the metal portions 1031 in the figure) includes three curved surfaces 1021 which are connected to form a continuous upper surface of the first elastic layer 102. The combined curved surface formed by the three curved surfaces 1021 matches the shape of a side of the corresponding metal portion 1031 close to the first elastic layer 102.

Further, each of the curved surfaces 1021 matches the shape of a side of the corresponding arch-shaped portion 1032 close to the first elastic layer 102. The total length of the arch-shaped portions 1032 may be the length of the metal portion 1031. Numbers of the arch-shaped portions 1032 and specific parameters of each of the arch-shaped portions 1032 are not limited, and may be determined according to actual conditions.

Figure 8:
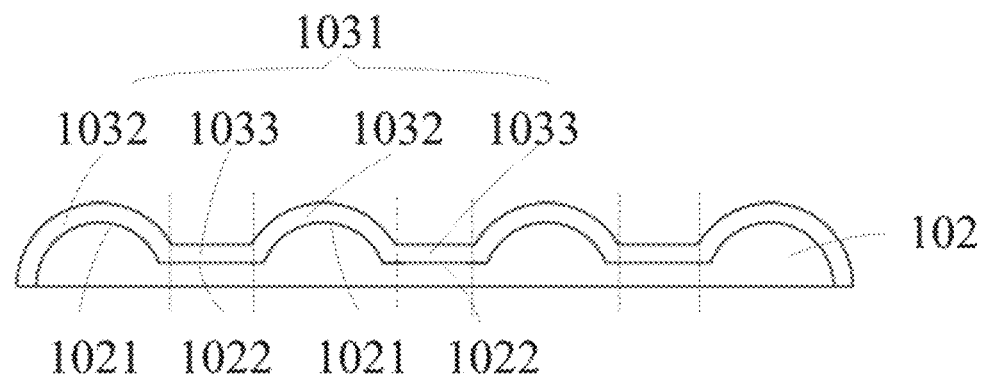
FIG. 8 is a schematic cross-sectional structure view of a third metal layer and a first elastic layer according to an embodiment of the present disclosure.

In another example, as shown in FIG. 8, in addition to the arch-shaped portions 1032, the metal portion 1031 further includes a plurality of connecting portions which are in a planar shape. Each of the connecting portions 1033 is provided between the adjacent arch-shaped portions 1032 to connect the adjacent arch-shaped portions 1032. A side of the first elastic layer 102 close to the metal layer 103 (i.e., the metal portions 1031 in the figure) includes four curved surfaces 1021 and three planes 1022. The curved surfaces 1021 and the planes 1022 are arranged alternately, so that a continuous upper surface of the first elastic layer 102 is formed. The combined curved surface formed by the four curved surfaces 1021 and the three planes 1022 matches a shape of a side of the corresponding metal portion 1031 close to the first elastic layer 102. Further, each of the curved surfaces 1021 matches a side of the corresponding arch-shaped portion 1032 close to the first elastic layer 102, and each of the planes 1022 respectively matches a shape of a side of the corresponding connecting portion 1033 close to the first elastic layer 102. The total length of the arch-shaped portions 1032 and the connecting portions 1033 may be the length of the metal portion 1031. Numbers of the arch-shaped portion 1032 and the connecting portion 1033 and specific parameters of each of the arch-shaped portions 1032 and the connecting portions 1033 are not limited, and may be determined according to actual conditions.

Figure 9:
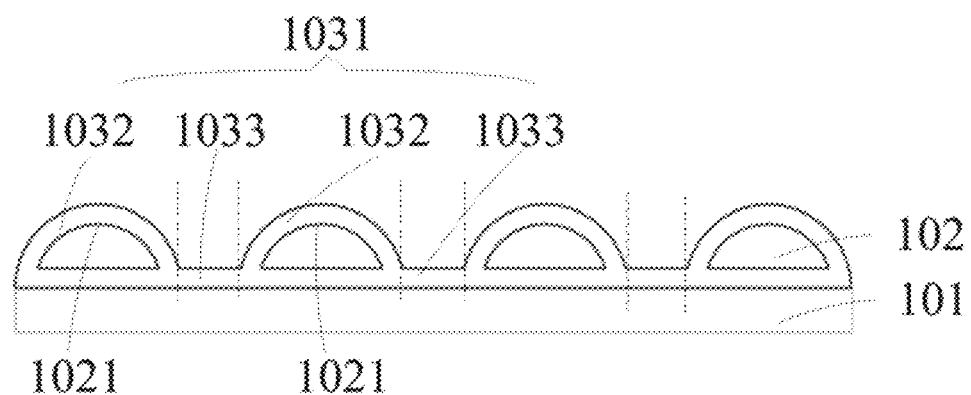
FIG. 9 is a schematic cross-sectional structure view of a fourth metal layer and a first elastic layer according to an embodiment of the present disclosure.

In another example, as shown in FIG. 9, the difference between FIG. 9 and FIG. 8 is that the connecting portion 1033 is disposed on the substrate 101, the first elastic layer 102 includes a plurality of elastic portions 1021, and the plurality of elastic portions 1021 have strip shapes, and the plurality of elastic portions 1021 are spaced apart from each other and arranged in parallel. When the plurality of metal portions 1031 are in strip shapes, and the plurality of metal portions 1031 are spaced apart from each other and arranged in parallel, the plurality of elastic portions 1021 and the plurality of metal portions 1031 are arranged to intersect with each other. Further, the plurality of elastic portions 1021 and the plurality of metal portions 1031 are disposed perpendicular to each other. Further, the elastic portions 1021 located between adjacent metal portions 1031 may be exactly the same. Further, the elastic portions 1021 located between any two adjacent metal portions 1031 may be exactly the same. The elastic portions 1021 can be completely the same. When the plurality of metal portions 1031 are connected to form the continuous metal layer 103, the plurality of elastic portions 1021 are completely covered under the metal layer 103. It can be understood that the elastic portion 1021 provided between the connecting portion 1033 and the substrate 101 is omitted. The shapes of the elastic portions 1021 match the plurality of corresponding arch-shaped portions 1032. The related description may refer to the related description in the embodiments mentioned above.

When the metal portions 1031 include a plurality of arch-shaped portions 1032, a distance between the left and right ends of the arch-shaped portion 1032 may be between 1 μm and 100 μm.

In an embodiment, material of the first elastic layer 102 may include polydimethylsiloxane.

It should be noted that, as shown in FIGS. 6-9, all the metal portions 1031 include at least one arch-shaped portion 1032 in an arch shape. Correspondingly, a side of the first elastic layer 102 close to the metal layer 103 (i.e., the metal portions 1031 in the figure) includes at least one curved surface 1021 that matches the shape of the arch-shaped portion 1032. It can be understood that when the bending area 100 is in a flat state, there is a compressive stress inside the metal layer 103. When the bending area 100 is gradually bent, the compressive stress existing inside the metal layer 103 is gradually reduced to zero, and eventually becomes a tensile stress. When an angle of the bending gradually increases, the tensile stress existing inside the metal layer 103 gradually increases. Thus, compared with the prior art, when the bending of the bending area 100 is at a certain degree, the tensile stress existing in the metal layer 103 in the embodiment of the present disclosure is small, so that the fracture resistance of the film layers in the bending area is improved.

Further, as shown in FIGS. 8-9, in the metal portions 1031, each of the arch-shaped portions 1032 may also present a wrinkle shape. Specifically, please refer to FIG. 10, the area A may be the connecting portion 1033 in FIGS. 8-9. That is, the area A may present a flat plane. The area B may be arch-shaped portions 1032 in FIG. 8-9. That is, the arch-shaped portions 1032 may further present wrinkle shapes. It can be understood that, as shown in FIGS. 7-9, in one metal portion 1031, the plurality of the arch-shaped portions 1032 arranged continuously may be alternately arranged in convex arch shapes and concave arch shapes, so that the metal portions 1031 have wrinkle shapes as a whole as shown in the area B in FIG. 10.

Figure 10:
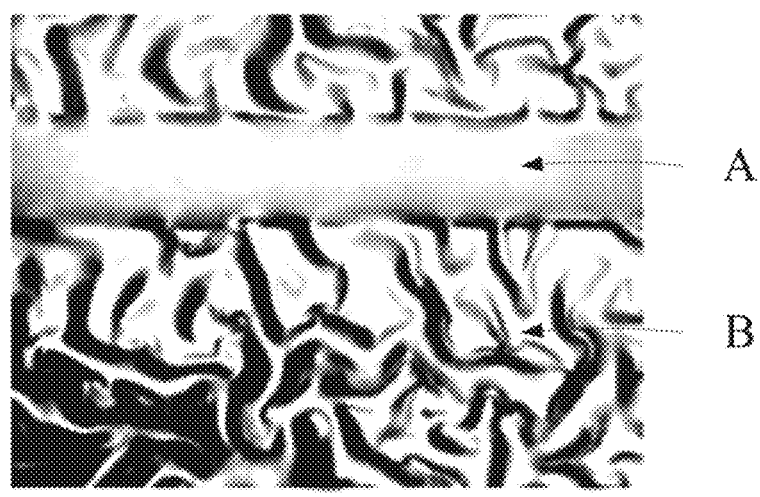
FIG. 10 is a physical schematic view of a metal layer in a bending area of another display panel according to an embodiment of the present disclosure.
Figure 11:
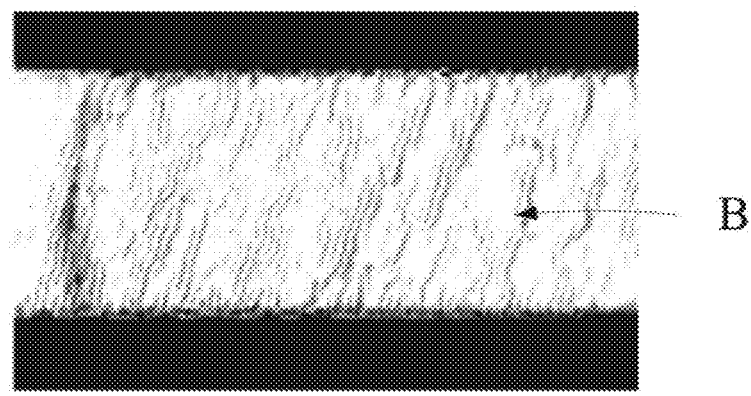
FIG. 11 is a physical schematic view of a wrinkled area of a metal layer in a bending area of another display panel according to an embodiment of the present disclosure.

It can be understood that, as shown in FIG. 11, it is a macroscopic presentation of the entire area B in FIG. 10.

Figure 12:
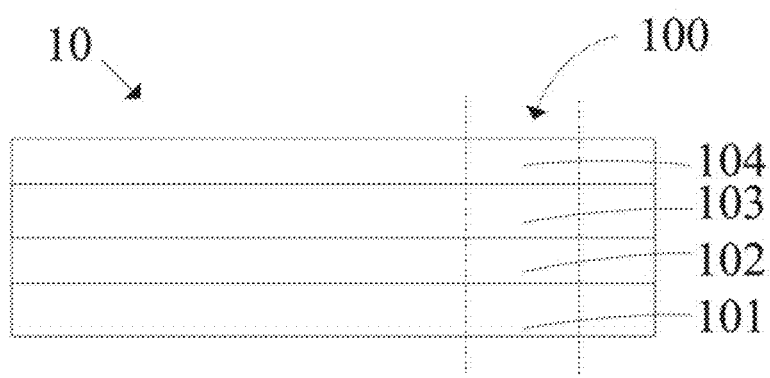
FIG. 12 is a schematic cross-sectional structure view of another display panel according to an embodiment of the present disclosure.

In an embodiment, as shown in FIG. 12, the display panel 10 includes a bending area 100 used for the bending of the display panel 10. The bending area 100 includes a plurality of film layers. The plurality of film layers include a substrate 101, a first elastic layer 102 disposed on the substrate 101, and a metal layer 103 disposed on the first elastic layer 102. The plurality of film layers further include a second elastic layer 104 disposed on the metal layer 103.

In an embodiment, a side of the second elastic layer 104 close to the metal layer 103 includes at least one curved surface, and each of the curved surfaces matches a side of the corresponding metal portion 1031 close to the second elastic layer 104. A side of the second elastic layer 104 away from the metal layer 103 is a plane which is parallel to the substrate 101.

In an embodiment, material of the second elastic layer 104 may also include polydimethylsiloxane.

The Young's modulus of the first elastic layer 102 and the second elastic layer 104 may be smaller than the Young's modulus of the first substrate and the third substrate.

It should be noted that, as shown in FIG. 12, compared with FIGS. 6-9, the second elastic layer 104 is formed on the metal layer 203. That is, the upper surface and lower surface of the metal layer 203 are respectively provided with the first elastic layer 102 and the second elastic layer 104, which can further protect the metal layer 203 and improve the fracture resistance of the film layers in the bending area 100.

Figure 13:
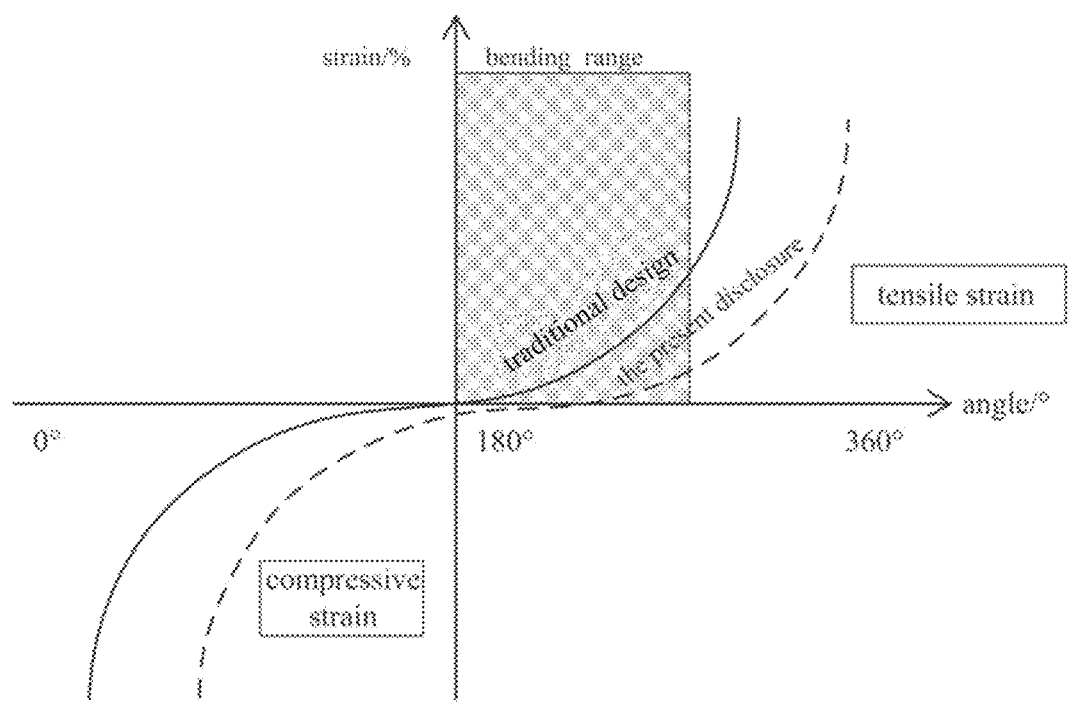
FIG. 13 is a strain curve diagram of the present disclosure and the conventional design.

As shown in FIG. 13, FIG. 13 is a strain curve simulation diagram of the present disclosure and the traditional design. Specifically, with reference to FIG. 1, the abscissa in FIG. 13 represents an included angle between the binding area 01 and the display area 02, the ordinate represents the strain of the bending area 03, and the "bending range" represents the bending area 03. It can be understood that the embodiments shown in FIGS. 2-9 are adopted for the bending area 03 of the present disclosure, that is, the metal layer 103 in the bending area 03 including a plurality of the arch-shaped portions 1032 and/or presenting a wrinkle shape. When the included angle is 0, there has been a certain compressive strain in the bending area 03. Thus, when the included angle between the binding area 01 and the display area 02 increases, the certain compressive strain of the bending area 03 is gradually reduced to 0, and then becomes a gradually increased tensile stress. Further, it can be observed that compared with the traditional design, the tensile strain curve of the present disclosure is the tensile strain curve of the traditional design shifted to the right by a distance. In the "bending range", when the included angle is constant, the tensile strain of the present disclosure is always less than the tensile strain of the traditional design. That is, the present disclosure improves the fracture resistance of the film layers in the bending area 03.

The present disclosure provides a method of manufacturing a display panel. Please refer to FIGS. 14-18 for details.

Figure 14:
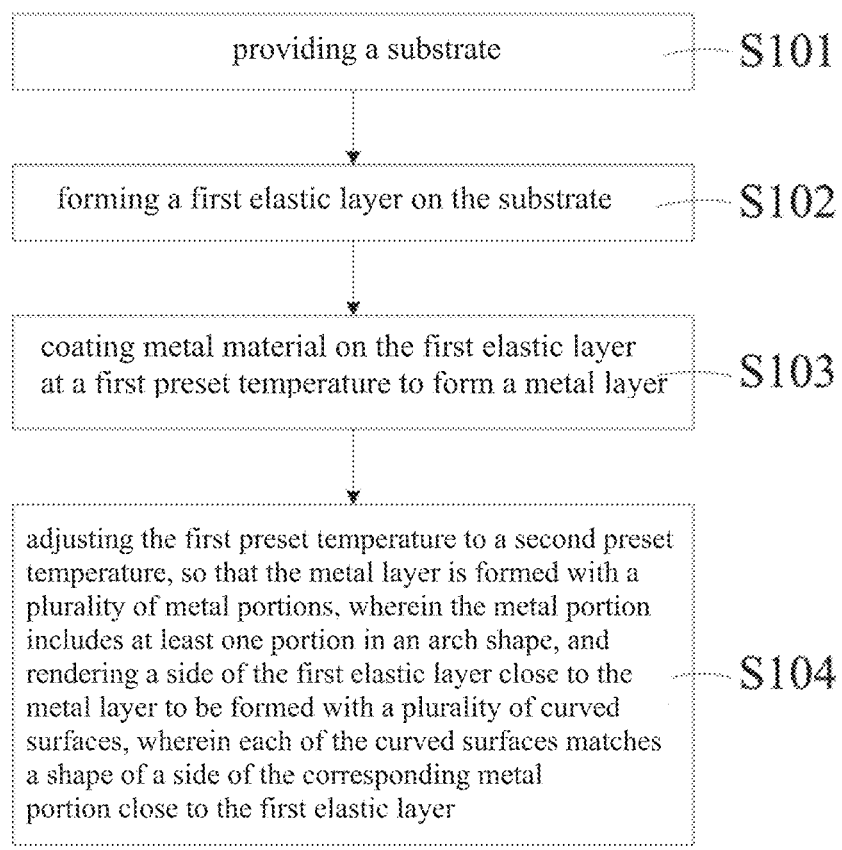
FIG. 14 is a schematic flowchart of a method of manufacturing a display panel according to an embodiment of the present disclosure.
Figure 15:
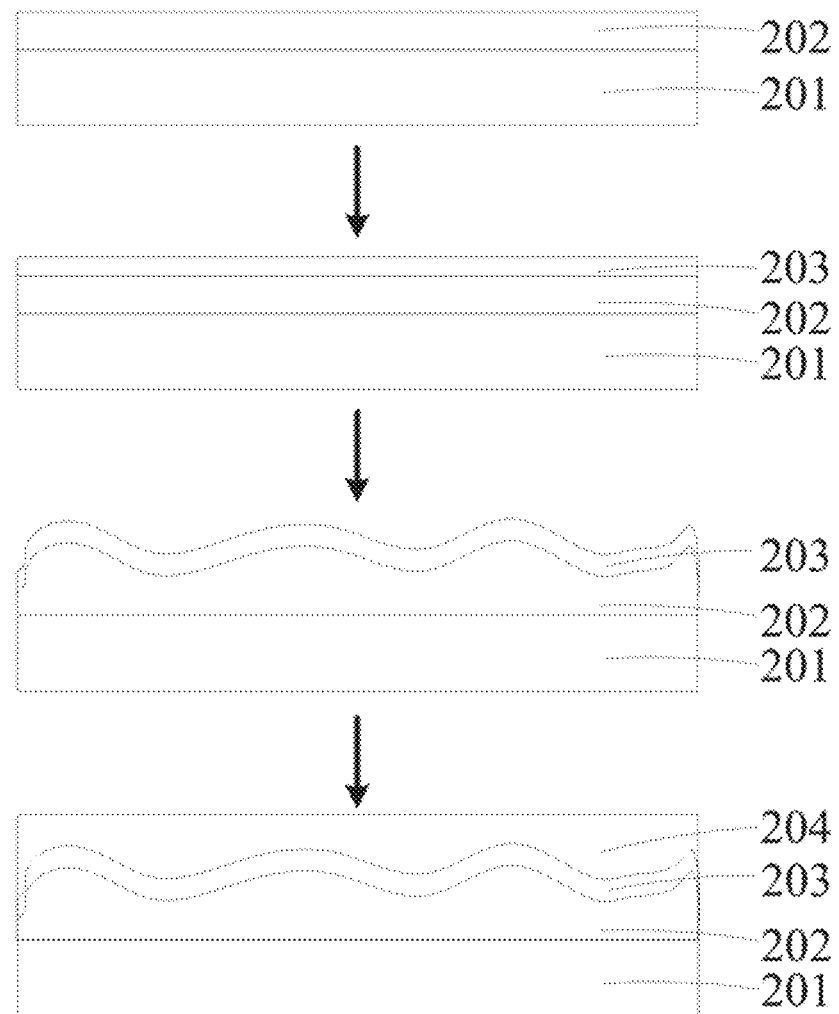
FIG. 15 is a schematic scene view of a method of manufacturing a display panel according to an embodiment of the present disclosure.

In an embodiment, as shown in FIGS. 14 and 15, the method of manufacturing the display panel may include the following steps.

S101: providing a substrate 201.

The description about the substrate 201 may refer to the related description about the substrate 201 mentioned above.

S102: forming a first elastic layer 202 on the substrate 201.

It can be understood that, before the step S102 is performed, the substrate 201 may be cleaned to remove foreign matters on the substrate 201.

Specifically, after coating the corresponding liquid material on the substrate 201, the substrate coated with the corresponding material may be placed at a third preset temperature to be cured to form the first elastic layer 202.

Material of the first elastic layer 202 may include polydimethylsiloxane.

A thickness of the first elastic layer 202 may be between 1 μm and 2 μm. Further, a thickness of the first elastic layer may be 1.5 μm.

Specifically, the thickness of the first elastic layer 202 may be controlled by controlling the viscosity of the liquid material of the polydimethylsiloxane.

The third preset temperature may not be lower than 25° C. The substrate coated with the corresponding liquid material may be heated by a heating tool so as to be cured to form the first elastic layer 202.

S103: at a first preset temperature, applying metal material on the first elastic layer 202 to form a metal layer 203.

The first preset temperature may not be lower than 100° C.

The metal layer may be a flat and continuous film.

S104: adjusting the first preset temperature to a second preset temperature, so that the metal layer 203 is formed with a plurality of metal portions, wherein the metal portion includes one portion in an arch shape, and rendering a side of the first elastic layer 202 close to the metal layer to be formed with a plurality of curved surfaces, wherein each of the curved surfaces matches a shape of a side of the corresponding metal portion close to the first elastic layer 202.

The second preset temperature may not be higher than 25° C.

It can be understood that after the metal layer 203 undergoes thermal expansion, it may shrink from the previous flat shape to a wrinkle shape, and the metal portions may be connected to form a continuous wrinkle shape. Specifically, the related description of the metal layer 203 may refer to the related description in the embodiments shown in FIGS. 3-4 and 6-8.

Specifically, the metal layer 203 may be formed with a wrinkle shape as shown in FIG. 11.

It should be noted that the metal layer 203 presents a wrinkle shape after steps S101-S104. Correspondingly, a side of the first elastic layer 202 close to the metal layer 203 includes at least one curved surface matching the wrinkle. It can be understood that when the bending area 100 is in a flat state, there is a compressive stress inside the metal layer 203. When the bending area 100 is gradually bent, the compressive stress existing inside the metal layer 203 gradually decreases to zero, and eventually becomes a tensile stress. When an angle of the bending gradually increases, the tensile stress existing inside the metal layer 203 gradually increases. Thus, compared with the prior art, when the bending of the bending area 100 is at a certain degree, the tensile stress existing in the metal layer 203 in the embodiment of the present disclosure is small, which improves the fracture resistance of the film layers of the bending area.

In an embodiment, after step S104, the method further includes the following steps:

S105: forming a second elastic layer 204 on the metal layer 203 where the plurality of metal portions are formed.

A side of the second elastic layer 204 close to the metal layer 203 includes at least one curved surface, and each of the curved surfaces matches a shape of a side of the corresponding metal portion close to the second elastic layer 204. A side of the second elastic layer 204 away from the metal layer 203 is a plane which is parallel to the substrate.

Material of the second elastic layer 204 may also include polydimethylsiloxane.

A thickness of the second elastic layer 204 may be between 1 μm and 2 μm. Further, a thickness of the second elastic layer 204 may be 1.5 μm.

It should be noted that, after step S105, compared with steps S101-S104, forming the second elastic layer 204 on the metal layer 203 with a wrinkle shape, that is, respectively providing the first elastic layer 202 and the second elastic layer 204 on the upper surface and lower surface of the metal layer 203 can further protect the metal layer 203, and improve the crack resistance of the film layers of the bending area 100.

Figure 16:
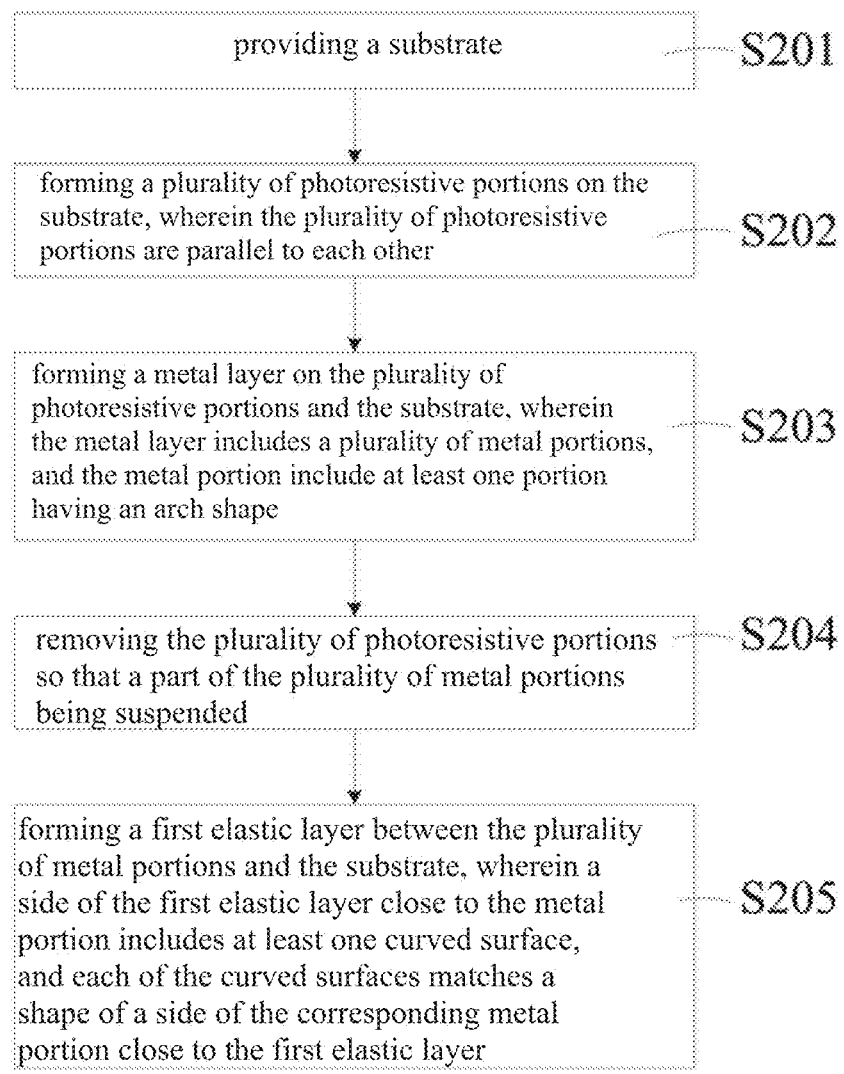
FIG. 16 is a schematic flowchart of another method of manufacturing a display panel according to an embodiment of the present disclosure.
Figure 17:
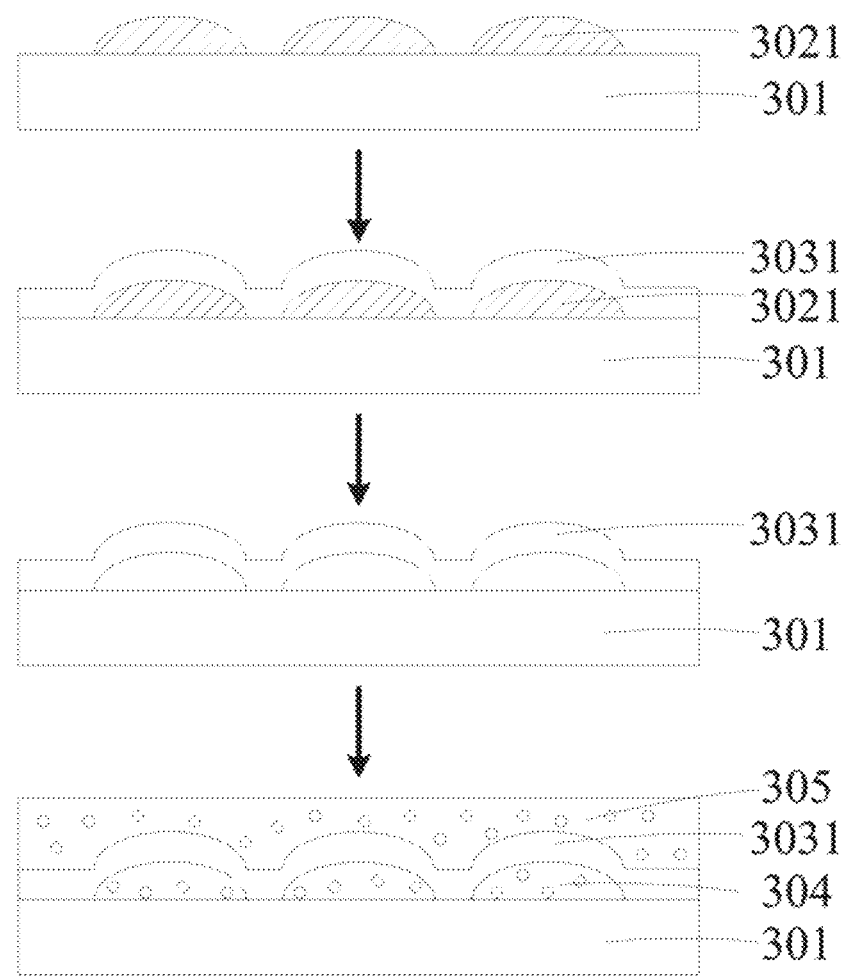
FIG. 17 is a schematic scene view of another method of manufacturing a display panel according to an embodiment of the present disclosure.
Figure 18:
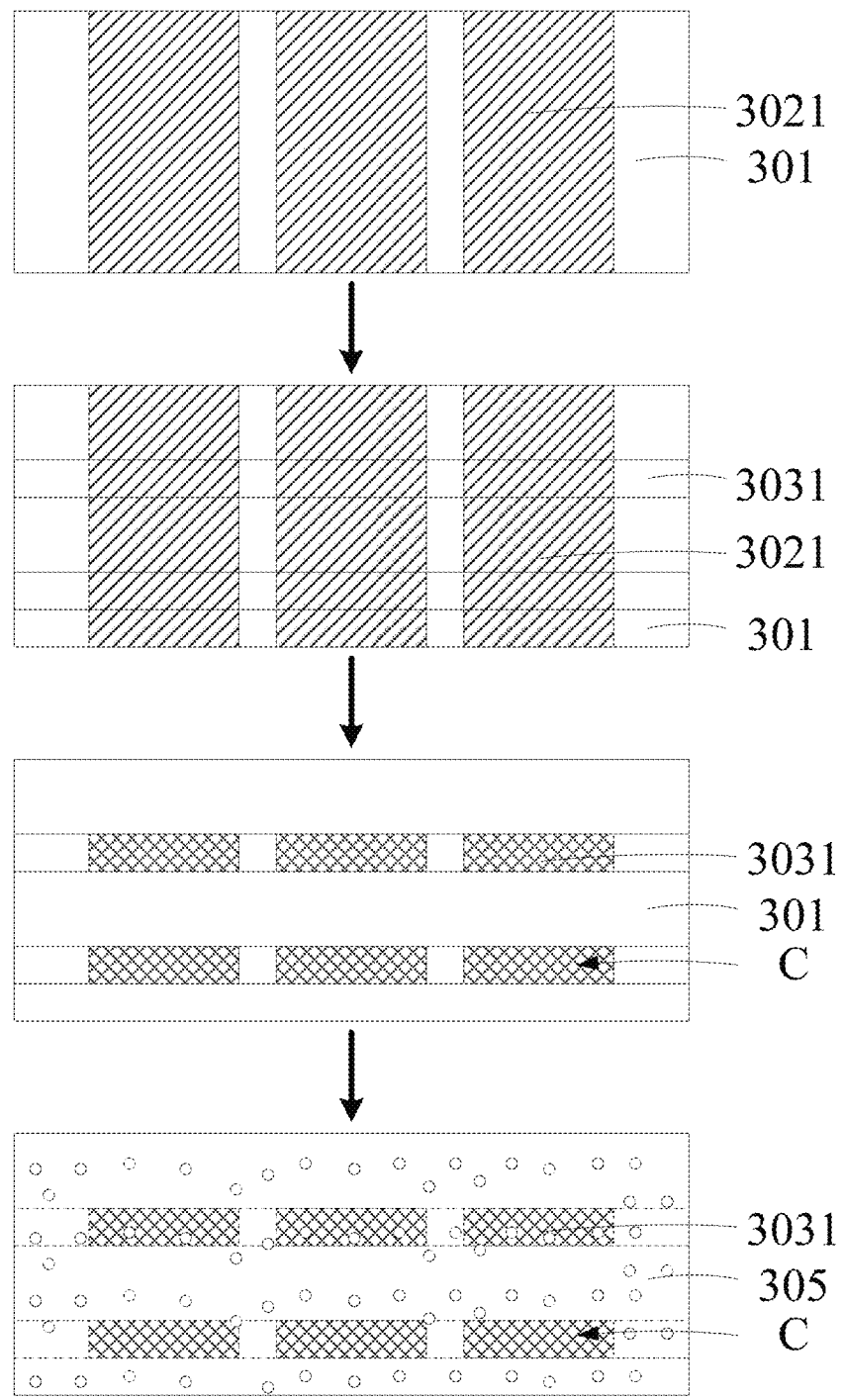
FIG. 18 is a schematic top view corresponding to FIG. 17.

In an embodiment, as shown in FIGS. 16-18, wherein FIG. 18 is a top view corresponding to FIG. 17, the method of manufacturing the display panel may further include the following steps.

S201: providing a substrate 301.

The description about the substrate 301 may refer to the related description about the substrate 301 mentioned above.

S202: forming a plurality of photoresistive portions 3021 on the substrate 301, and the plurality of photoresistive portions 3021 are parallel to each other.

Refer to FIG. 18, a thickness of the photoresistive portion 3021 may be between 1 μm and 2 μm. Further, a thickness of the photoresistive portion may be 1.5 μm. The photoresistive portion 3021 may be in a strip shape. The specific direction in which the plurality of photoresistive portions 3021 are arranged in parallel is not limited, the distance between adjacent photoresistive portions 3021 is also not limited, and the specific shapes of the plurality of photoresistive portions 3021 are also not limited.

S203: forming a metal layer on the plurality of photoresistive portions 3021 and the substrate 301. The metal layer includes a plurality of metal portions 3031 which include at least an arch-shaped portion.

Refer to FIG. 18, the metal portions 3031 may be in strip shapes, and the plurality of metal portions 3031 may be arranged in parallel and spaced apart from each other. It can be understood that the metal portions 3031 and the photoresistive portions 3021 are disposed to intersect mutually, and the intersecting areas of the metal portions 3031 and the photoresistive portions 3021 are the arch-shaped portions. The specific direction in which the plurality of metal portions 3031 are arranged in parallel is not limited, the distance between adjacent metal portions 3031 is not limited, and the specific shape of the plurality of metal portions 3031 is also not limited.

Specifically, the related description about the metal portions 3031 may refer to the related description of the embodiment shown in FIG. 8 mentioned above.

S204: removing the plurality of photoresistive portions 3021, so that a part of the plurality of metal portions 3031 is suspended.

Specifically, the substrate obtained by the step S203 may be immersed in an organic solution, and the plurality of photoresistive portions 3021 may be slowly removed by lateral undercut. Further, the organic solution which is capable of chemically reacting with the photoresistive portions 3021 to remove the photoresistive portions 3021 is selected.

Refer to FIGS. 17-18, it can be understood that an area C of the metal portions 3031 previously in contact with the photoresistive portions 3021 is in a suspended state after the plurality of photoresistive portions 3021 are removed. Further, since the area C in the suspending state, i.e., the arch-shaped portion is in an arched shape, when the area is bent, the tensile stress on the area will be reduced, which can reduce the risk of film fracture in the area.

S205: forming a first elastic layer 304 between the plurality of metal portions 3031 and the substrate 301. A side of the first elastic layer 304 close to the metal portion 3031 includes at least one curved surface. Each of the curved surface matches the shape of a side of the corresponding metal portion 3031 close to the first elastic layer 304.

Specifically, the substrate is allowed to stand sufficiently after the corresponding liquid material is coated on the substrate obtained by the step S204, so that the liquid material enters under the arch-shaped portion. Further, a method of vacuum de-bubble may be applied, so that the liquid material under the arch-shaped portion may be uniform and compact.

It can be understood that, since the liquid material is directly applied to the substrate, an area between any adjacent metal portions 3031 is also filed with the liquid material.

It can be understood that, since only the arch-shaped portion of the metal portions 3031 is suspended, the first elastic layer 304 is actually disposed between the arch-shaped portion and the substrate 301, and between the adjacent arch-shaped portions disposed on the substrate 301.

In an embodiment, after the step S205, the method may further include the following step:

S206: forming a second elastic layer 305 on the plurality of metal portions 3031 and the first elastic layer 304.

Specifically, refer to FIGS. 17-18, when the amount of the liquid material applied is sufficient, the second elastic layer 305 may be formed on the metal layer. Specifically, refer to FIG. 17, a side of the second elastic layer 305 close to the metal layer includes at least one curved surface, and the shape of the curved surface matches the shape of the corresponding arch-shaped portion of the metal portions 3031. A side of the second elastic layer 305 away from the metal layer may be a flat and continuous plane. Refer to FIG. 18, when the amount of the liquid material applied is sufficient, only the second elastic layer 305 can be observed in a top view.

Materials of the first elastic layer 304 and the second elastic layer 305 may include polydimethylsiloxane.

Refer to FIG. 17, a total thickness of the first elastic layer 304 and the second elastic layer 305 may be between 1 μm and 2 μm. Further, a total thickness of the first elastic layer 304 and the second elastic layer 305 may be 1.5 μm.

It should be noted that each of the metal portions 3031 in the metal layer includes a plurality of arched shapes after steps S201-S205 or steps S201-S206. Accordingly, a side of the first elastic layer 304 and a side of the second elastic layer 305 close to the metal layer respectively include at least one curved surface matching the arch-shaped portion. It can be understood that when the bending area 100 is in a flat state, there is compressive stress inside the metal layer. When the bending area 100 is gradually bent, a portion of the metal layer in an arch shape gradually adhere to the first elastic layer 304 and the second elastic layer 305, and the compressive stress existing in the metal layer gradually decreases to zero, and eventually becomes tensile stress. When the bending angle gradually increases, the tensile stress existing in the metal layer gradually increases. Thus, when the bending area 100 is bent at a certain degree, the tensile stress existing in the metal layer in the embodiment of the present disclosure is smaller than that of the prior art, so that the fracture resistance of the film layers of the bending area 100 is improved.

Further, compared with the prior art, by forming the metal layer with an arch shape, the two methods of manufacturing the display panels mentioned above omit photomasks and patterning processes so as to save manufacturing time and manufacturing cost.

In an embodiment, the method may further comprise the following step provided between the steps S104 and S105:

S306: patterning the metal layer 203 so that the plurality of metal portions are spaced apart from each other and arranged in parallel.

After the step S104, it can be understood that the metal layer 203 is still a whole film layer, but the surface thereof has a wrinkle shape. After the step S306, it can be understood that the metal layer 203 includes a plurality of metal portions spaced apart from each other and arranged in parallel. Further, at least one via hole may be provided on the metal portions by the step S306.

In an embodiment, the method may further include the following step after the steps S105 and S206.

S307: sequentially forming a planar layer, a pixel definition layer, a support layer and the like on the second elastic layer 204/305.

Material of the pixel definition layer may include positive or negative photosensitive resin material with hydrophobicity. A light-emitting layer may be formed in an opening area of the pixel definition layer, and the light-emitting layer may be manufactured by an inkjet printing process.

The supporting layer includes a plurality of supporting pillars. Material of the supporting pillars includes flexible polymer material.

The present disclosure provides a display panel and a method of manufacturing the same. The bending area of the display panel includes a metal layer and a first elastic layer.

In the present disclosure, the metal layer is configured to include a plurality of metal portions, and the metal portion includes at least one portion having an arch shape. A side of the first elastic layer close to the metal layer is provided to a plurality of curved surfaces, and each of the curved surfaces matches a side of a corresponding metal portion close to the first elastic layer. Thus, when the bending area is bent, the stress received by the film layers take is gradually reduced from compressive stress to zero, and then becomes the gradually increased tensile stress. The disclosure can reduce the stress received by the bending area during bending, thereby improving the fracture resistance of the film layers in the bending area.

The display panel and the method of manufacturing the same provided by the embodiments of the present disclosure have been described in detail above. Specific embodiments have been used herein to explain the principle and implementation of the present disclosure. The description of the above embodiments is merely used to help understand the technical solution and the core ideas of the present disclosure. It should be understood by persons of ordinary skill in the art that modifications may still be made to the technical solutions described in the embodiments, or equivalent replacements may be made to some technical features in the technical solutions, as long as such modifications or replacements do not cause the essence of corresponding technical solutions to depart from the spirit and scope of the technical solutions in the embodiments of the present disclosure.

What is claimed is:

1. A method of manufacturing a display panel, comprising steps of:

providing a substrate;

forming a first elastic layer on the substrate;

coating metal material on the first elastic layer at a first preset temperature to form a metal layer; and adjusting the first preset temperature to a second preset temperature, so that the metal layer is formed with a plurality of metal portions, wherein the metal portion includes at least one portion in an arch shape, and rendering a side of the first elastic layer close to the metal layer to be formed with a plurality of curved surfaces, wherein each of the curved surfaces matches a shape of a side of the corresponding metal portion close to the first elastic layer.

2. The method of manufacturing the display panel of claim 1, wherein after the step of adjusting the first preset temperature to the second preset temperature, so that the metal layer is formed with a plurality of metal portions, wherein the metal portion includes at least one portion in the arch shape, and rendering the side of the first elastic layer close to the metal layer to be formed with the plurality of curved surfaces, wherein each of the curved surfaces matches the shape of the side of the corresponding metal portion close to the first elastic layer, the method further comprising:

forming a second elastic layer on the metal layer, wherein the metal layer is formed with the plurality of metal portions.

3. The method of manufacturing the display panel of claim 2, wherein both materials of the first elastic layer and the second elastic layer include polydimethylsiloxane.

4. A method of manufacturing a display panel, comprising steps of:

providing a substrate;

forming a plurality of photoresistive portions on the substrate, wherein the plurality of photoresistive portions are parallel to each other;

forming a metal layer on the plurality of photoresistive portions and the substrate, wherein the metal layer includes a plurality of metal portions, and the metal portion includes at least one portion having an arch shape;

removing the plurality of photoresistive portions so that a part of the plurality of metal portions is suspended; and forming a first elastic layer between the plurality of metal portions and the substrate, wherein a side of the first elastic layer close to the metal portions includes at least one curved surface, and each of the curved surfaces matches a shape of a side of the corresponding metal portion close to the first elastic layer.

5. The method of manufacturing the display panel of claim 4, wherein material of the first elastic layer includes polydimethylsiloxane.

\* \* \* \* \*